United States Patent
Chih et al.

(10) Patent No.: US 8,536,039 B2
(45) Date of Patent: Sep. 17, 2013

(54) NANO-CRYSTAL GATE STRUCTURE FOR NON-VOLATILE MEMORY

(75) Inventors: Yue-Der Chih, Hsin-Chu (TW); Chrong Jung Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 6 days.

(21) Appl. No.: 12/731,665

(22) Filed: Mar. 25, 2010

(65) Prior Publication Data

US 2011/0233654 A1    Sep. 29, 2011

(51) Int. Cl.
*H01L 21/3205* (2006.01)
*H01L 21/4763* (2006.01)

(52) U.S. Cl.
USPC .......................... 438/591; 438/588

(58) Field of Classification Search
None
See application file for complete search history.

(56) References Cited

U.S. PATENT DOCUMENTS

| | | | |
|---|---|---|---|
| 5,687,118 A | 11/1997 | Chang | |
| 5,852,306 A | 12/1998 | Forbes | |
| 5,909,392 A | 6/1999 | Chang et al. | |
| 6,054,349 A | 4/2000 | Nakajima et al. | |
| 6,090,666 A | 7/2000 | Ueda et al. | |
| 6,690,059 B1 | 2/2004 | Lojek | |
| 6,740,928 B2 | 5/2004 | Yoshii et al. | |
| 6,743,709 B2 | 6/2004 | Kan et al. | |
| 6,808,986 B2 | 10/2004 | Rao et al. | |
| 6,816,414 B1* | 11/2004 | Prinz | 365/185.29 |
| 7,101,760 B1 | 9/2006 | Lojek | |
| 7,119,395 B2 | 10/2006 | Gutsche et al. | |
| 7,190,623 B2 | 3/2007 | Hsu et al. | |
| 7,221,016 B2 | 5/2007 | Inoue et al. | |
| 7,335,594 B1 | 2/2008 | Wang et al. | |
| 7,355,238 B2 | 4/2008 | Takata et al. | |
| 7,378,310 B1 | 5/2008 | Wang et al. | |
| 7,391,640 B2 | 6/2008 | Tang et al. | |
| 7,416,945 B1 | 8/2008 | Muralidhar et al. | |
| 7,579,646 B2 | 8/2009 | Wang et al. | |
| 7,589,387 B2 | 9/2009 | Hwang et al. | |
| 2001/0052615 A1* | 12/2001 | Fujiwara | 257/315 |
| 2004/0130941 A1 | 7/2004 | Kan et al. | |

(Continued)

FOREIGN PATENT DOCUMENTS

CN    1581492 A    2/2005

OTHER PUBLICATIONS

Dana, A. et al. "Charge Retention in Quantized Energy Levels of Nanocrystals", Physica E: Low-dimensional Systems and Nanostructures, Apr. 2007, 38(1-2); pp. 94-98.

(Continued)

*Primary Examiner* — Hoang-Quan Ho
(74) *Attorney, Agent, or Firm* — Duane Morris LLP

(57) ABSTRACT

A non-volatile memory device is disclosed having a charge storage layer that incorporates a plurality of nano-crystals. A substrate having a source region and a drain region is provided. Select and control gates are formed on the substrate. The charge storage layer is provided between the control gate and the substrate. The nano-crystals in the charge storage layer have a size of about 1 nm to about 10 nm, and may be formed of Silicon or Germanium. Writing operations are accomplished via hot electron injection, FN tunneling, or source-side injection. Erase operations are accomplished using FN tunneling. The control gate is formed of a single layer of polysilicon, which reduces the total number of processing steps required to form the device, thus reducing cost.

20 Claims, 4 Drawing Sheets

(56) References Cited

U.S. PATENT DOCUMENTS

| | | |
|---|---|---|
| 2005/0014335 A1 | 1/2005 | Goldbach et al. |
| 2005/0258467 A1 | 11/2005 | Wang et al. |
| 2006/0030105 A1 | 2/2006 | Prinz et al. |
| 2007/0045719 A1 | 3/2007 | Wang et al. |
| 2007/0085130 A1 | 4/2007 | Wang |
| 2007/0272916 A1 | 11/2007 | Wang et al. |
| 2008/0182428 A1* | 7/2008 | Merchant et al. ............. 438/787 |
| 2008/0242022 A1* | 10/2008 | Rao et al. ...................... 438/257 |
| 2008/0303094 A1* | 12/2008 | Rao et al. ...................... 257/365 |
| 2009/0219763 A1 | 9/2009 | Kuo |
| 2011/0115009 A1* | 5/2011 | Tan et al. ...................... 257/314 |

OTHER PUBLICATIONS

Official Action issued May 4 2012, in counterpart Chinese Patent Application No. 201110058518.7.

* cited by examiner

NANO-CRYSTAL GATE STRUCTURE FOR NON-VOLATILE MEMORY

FIELD OF THE DISCLOSURE

The invention relates generally to memory devices employed within semiconductor products, and more particularly to non-volatile memory devices having enhanced performance through the incorporation of structures containing nano-crystals.

BACKGROUND OF THE DISCLOSURE

Memory cell structures are commonly employed as data storage components within integrated circuits. They may be broadly classified into the categories of volatile memory cell structures and non-volatile memory cell structures. Volatile memory cell structures require constant external electrical power in order to preserve data stored within volatile memory cell structures. In comparison, non-volatile memory cell structures are able to store charge even when the memory cell structure is not otherwise externally electrically powered. Non-volatile memory cell structures are often used for data storage within transiently operated consumer products such as digital cameras.

Non-volatile memory cell structures that employ nano-crystals are currently of interest. Within such devices, a series of nano-crystals serve as a floating gate electrode within a device structure that may otherwise resemble a dual gate electrically programmable memory device. The use of nano-crystals a floating gate electrode is desirable since charge leakage is reduced in comparison with a floating gate electrode formed as a single component.

Although nano-crystal devices are desirable, they are nonetheless not entirely without problems. In particular, it is desirable to form such devices with enhanced performance. Enhanced performance is often related to enhanced data storage capabilities, which in turn are generally correlated with enhanced charge storage capabilities.

SUMMARY

A memory cell is disclosed, comprising a substrate having a source region and a drain region, a control gate disposed over the substrate, and a charge storage layer disposed between the substrate and the control gate. The charge storage layer comprises an insulating material having a plurality of nano-crystals, and the control gate consists of a single layer of polysilicon.

A non-volatile memory device is disclosed, comprising a semiconductor substrate having a source region and a drain region, a channel region disposed between the source and drain region, a charge storage layer formed above the channel region, and a control gate formed above the charge storage layer. The charge storage layer further comprises an insulating material having a plurality of conductive nano-crystals.

A method of forming a non-volatile memory device is disclosed, comprising providing a semiconductor substrate; forming source and drain regions in the semiconductor substrate, the source and drain regions separated by a channel region; forming a charge storage layer over the substrate, the charge storage layer positioned between the source region and the drain region; and forming a control gate comprising a single layer of polysilicon over the charge storage layer, wherein the charge storage layer comprises a plurality of nano-crystals

BRIEF DESCRIPTION OF THE DRAWINGS

The objects, features and advantages of the invention are understood within the context of the description of the exemplary embodiments, as set forth below. The description of the exemplary embodiments is understood within the context of the accompanying drawings, which form a material part of this disclosure, wherein.

DETAILED DESCRIPTION

The disclosed device a non-volatile memory device having enhanced performance due to the presence of a nano-crystal material disposed beneath the control gate. The nano-crystal containing layer enhances charge retention, thus resulting in a more efficient and reliable storage structure.

Figure 1:
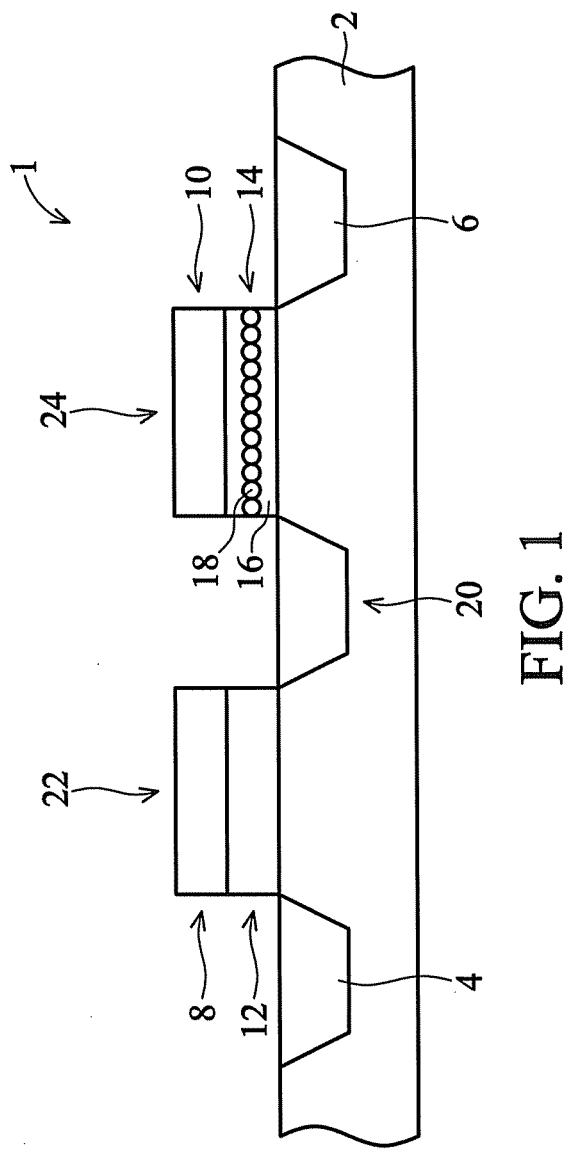
FIG. 1 is a cross section view of a first exemplary embodiment of a non-volatile memory device.

Referring to FIG. 1, a first exemplary embodiment of a non-volatile memory device 1 comprises a substrate 2, a source region 4, a drain region 6, a select gate 8 and a control gate 10. A gate oxide layer 12 may be disposed beneath the select gate 8, and a charge storage layer 14 may be disposed beneath the control gate 10. In one embodiment, the charge storage layer 14 is a dielectric material 16 that includes a plurality of nano-crystals 18. In one embodiment, the nano-crystals may be formed from Silicon. A doped region 20 may be positioned in the substrate 2 between the select gate 8 and the control gate 10.

The source, and drain regions 4, 6 and the doped region 20, may be n-doped regions or p-doped regions, depending on the type of device desired (i.e., NMOS or PMOS). The select gate 8 and the control gate 10 can be polysilicon layers, policide metal layers, or metal layers. As noted, the charge storage layer 14 may comprise a plurality of separated Si dots 18 dispersed in a dielectric material layer 16. Each of these dots 18 can trap and store charges. Data can thus be stored efficiently (and correctly) as long as a preponderance of the dots maintain the desired positive or negative charge. This is in contrast with conventional non-volatile memory devices that use a single conductive polysilicon gate to store charges. With conventional devices, if even a single leakage path exists within the gate, the charge can be drawn down to zero, affecting reliability of the device. Single leakage paths have no such impact with the disclosed device since each nano-crystal is a charge storage device.

The select gate 8, the gate oxide layer 12 and the doped region 20 thus arranged form a select transistor 22 for turning on and off the memory device 1. The control gate 10, the charge storage layer 14, the doped region 20, and the drain region 6 thus arranged form a storage transistor 24 for storing data in the memory device 1. A plurality of memory devices 1 of this type may be assembled together to create a memory array.

Figure 2:
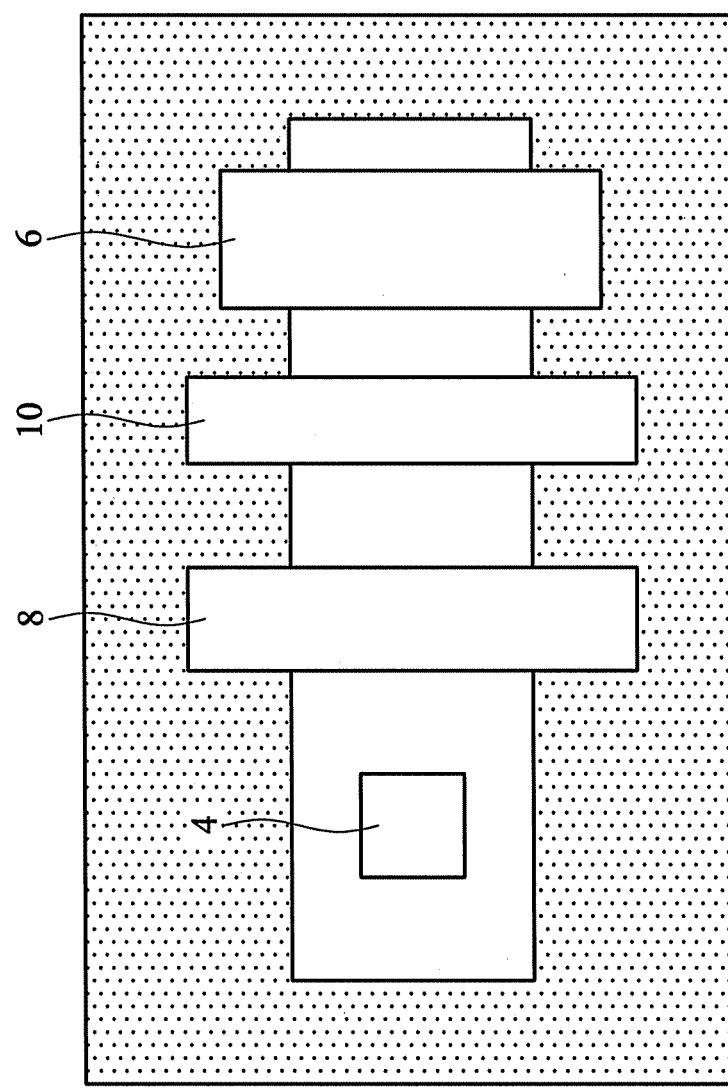
FIG. 2 is a plan view of the non-volatile memory device of FIG. 1.

FIG. 2 is a plan view of the device 1 of FIG. 1, which is particularly suited for 2 T memory cell applications. The plan view shows the source and its contact 4 the select gate (or word line) 8, the control gate 10 and the drain 6.

In one exemplary embodiment, programming operations for the device of FIG. 1 are achieved by injecting electrons into the charge storage layer 14 of the charge storage transistor 24 by either a channel hot-electron (CHE) injection mechanism, or by a Fowler-Nordheim (FN) tunneling mechanism. Erasing operations are achieved by an FN tunneling mechanism.

Thus, where the memory device 1 is configured as a P-channel device, CHE programming is accomplished by applying −1 V to the control gate 10, −3.3 V to the select gate 8, 0 V to the source region 4, and −6 V to the drain region 6. Alternatively, FN programming is accomplished by applying +8 V to the control gate 10, −6 V to the select gate 8, −4 V to the source region 4, and −4 V to the drain region 6. Under either mechanism, electrons generated by the voltage differences between regions are attracted to the control gate 10 and are thereby injected into the charge storage layer 14 of the storage transistor 24.

Reading of the P-channel device is accomplished by applying 0 V to the control gate 10, 0 V to the select gate 8, +0.8 V to the source region 4, and +1.8 V to the drain region 6.

Erasing of the P-channel device is accomplished by applying −6 V to the control gate 10, +3.3 V to the select gate 8, +6 V to the source region, and +6 V to the drain region 6. The voltage differences between regions thus expels electrons from the charge storage layer 14.

Where the memory device 1 is configured as an N-channel device, CHE programming is accomplished by applying +6V to the control gate 10, +3.3 V to the select gate 8, 0V to the source region 4, and +5V to the drain region 6. Alternatively, FN programming is accomplished by applying +8 V to the control gate 10, 0 V to the select gate 8, −4 V to the source region 4, and −4 V to the drain region 6.

Reading in the N-channel device is accomplished by applying +1.8 V to the control gate 10, +1.8 V to the select gate 8, +1 V to the source region 4, and 0 V to the drain region 6. Erasing is accomplished by applying −6 V to the control gate 10, +3.3 V to the select gate 8, +6 V to the source region, and +6 V to the drain region 6.

Figure 3:
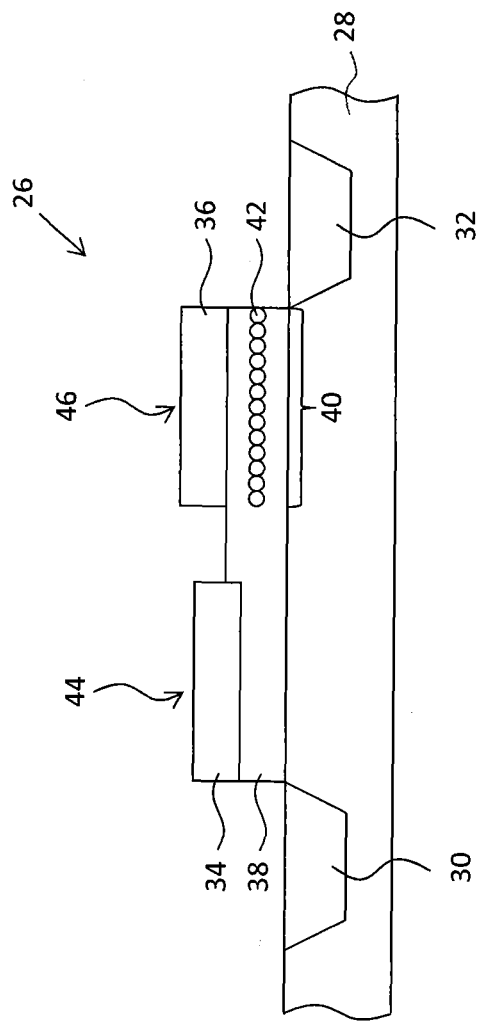
FIG. 3 is a cross section view of a second exemplary embodiment of a non-volatile memory device.

Referring to FIG. 3, a second exemplary embodiment of a 2 T non-volatile memory device 26 comprises a substrate 28, a source region 30, a drain region 32, a select gate 34 and a control gate 36. A continuous layer 38 may be positioned beneath the select gate 34 and the control gate 36. The portion of the continuous layer 38 positioned beneath the control gate 36 may comprise a charge storage portion 40 that includes a plurality of silicon nano-crystals 42. In one non-limiting embodiment, the continuous layer 38 is $SiO_2$.

For the device of FIG. 3, the source, and drain regions 30, 32 of the memory device 26 may be n-doped regions or p-doped regions, depending on the type of device desired (i.e., NMOS or PMOS). Further, the select gate 34 and the control gate 36 can comprise polysilicon layers, policide metal layers, or metal layers. The select gate 34 and the continuous layer 38, thus arranged, form a select transistor 44 for turning on and off the memory device 26. The control gate device 36, the charge storage portion 40, and the drain region 32, thus arranged, form a storage transistor 46 for storing data in the memory device 26. A plurality of memory devices 26 of this type may be assembled together to create a memory array.

In one exemplary embodiment, programming operations for the device of FIG. 3 are achieved by injecting electrons into the charge storage portion 40 of the charge storage transistor 46 by either a source side injection (SSI) mechanism, or by a Fowler-Nordheim (FN) tunneling mechanism. Erasing operations are achieved by an FN tunneling mechanism.

Where the memory device 26 is configured as a P-channel device, SSI programming is accomplished by applying −1 V to the control gate 36, −3.3 V to the select gate 34, 1~2 μA current to the source region 30, and −6 V to the drain region 32. Alternatively, FN programming is accomplished by applying +8 V to the control gate 36, −6 V to the select gate 34, −4 V to the source region 30, and −4 V to the drain region 32. Under either mechanism, electrons generated by the voltage differences between regions are attracted to the control gate 36 and are thereby injected into the charge storage portion 40 of the storage transistor 46.

Reading of the P-channel device is accomplished by applying 0 V to the control gate 36, 0 V to the select gate 34, +0.8 V to the source region 30, and +1.8 V to the drain region 34. Erasing of the P-channel device is accomplished by applying −6 V to the control gate 36, +3.3 V to the select gate 34, +6 V to the source region, and +6 V to the drain region 32. The voltage differences between regions thus expels electrons from the charge storage portion 40.

Where the memory device 1 is configured as an N-channel device, SSI programming is accomplished by applying +6V to the control gate 36, +3.3 V to the select gate 34, 1~2 μA current to the source region 30, and +5V to the drain region 32. Alternatively, FN programming is accomplished by applying +8 V to the control gate 36, 0 V to the select gate 32, −4 V to the source region 30, and −4 V to the drain region 32.

Reading in the N-channel device is accomplished by applying +1.8 V to the control gate 36, +1.8 V to the select gate 34, +1 V to the source region 30, and 0 V to the drain region 32. Erasing is accomplished by applying −6 V to the control gate 36, +3.3 V to the select gate 34, +6 V to the source region 30, and +6 V to the drain region 32.

Figure 4:
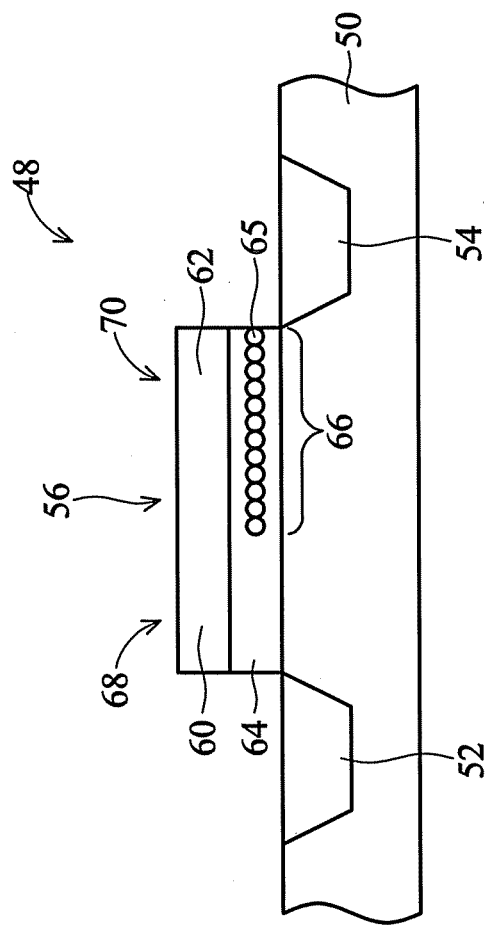
FIG. 4 is a cross-section view of a third exemplary embodiment of a non-volatile memory device.

Referring now to FIG. 4, a non-volatile memory device 48 is shown comprising a substrate 50, a source region 52, a drain region 54, a gate 56 having a select gate region 60 and a control gate region 62. A continuous layer 64 may be positioned beneath the select gate region 60 and the control gate region 62. The portion of the continuous layer 64 positioned beneath the control gate region 62 may comprise a charge storage portion 66 that includes a plurality of silicon nano-crystals 65.

As with the devices of FIGS. 1 and 3, the source, and drain regions 52, 54 of the memory device 48 may be n-doped regions or p-doped regions, depending on the type of device desired (i.e., NMOS or PMOS). The select gate region 60 and the control gate region 62 can comprise polysilicon layers, policide metal layers, or metal layers. The select gate region 60, the continuous layer 64, thus arranged, form a select transistor 68 for turning on and off the memory device 48. The control gate region 62, the charge storage portion 66, and the drain region 54, thus arranged, form a storage transistor 70 for storing data in the memory device 48. A plurality of memory devices 48 of this type may be assembled together to create a memory array.

As will be appreciated, the device 48 of FIG. 4 is particularly well suited for 1.5 T memory cell applications.

Programming operations for the device 48 are accomplished via FN tunneling mechanisms only. Programming, reading and erasing operations of the device 48 of FIG. 4 are accomplished by using the same applied biases as the associated operations described in relation to the device of FIG. 1, with the exception that no bias is applied to the select gate region 60.

The semiconductor substrate 2, 28, 50 may be formed of semiconductor materials as are conventional in the semiconductor product fabrication art. Such semiconductor materials may include, but are not limited to, silicon semiconductor materials, germanium semiconductor materials, silicon-germanium alloy semiconductor materials and semiconductor-on-insulator semiconductor materials. Typically, the semiconductor substrate is a silicon semiconductor substrate of appropriate dopant polarity, dopant concentration and crystallographic orientation.

The gate oxide layer 12, 38, 64 may comprise $SiO_2$ or other appropriate silicon-based insulating material. The gate oxide layer may also have a thickness of about 5 nanometers (nm) to about 30 nm.

The charge storage layer 14, 40, 66 may comprise a dielectric material such as $SiO_2$, or $Si_3N_4$, or other Si-based insulator. The nano-crystals 18, 42 disposed within the charge storage layer 14, 40, 66 may include nano-crystals of Silicon or Germanium. The nano-crystals may have dimensions (e.g., diameter) of from about 1 nm to about 10 nm. In one embodiment, the nano-crystals have a size of about 5 nm. The thickness of the charge storage layer may be from about 70 Angstroms (Å) to about 400 Å.

The select gate 8, 34, 60 and the control gate 10, 36, 62 can be formed from one or more polysilicon layers, policide metal layers, or metal layers formed to a thickness of from about 500 Å to about 3,000 Å. In one embodiment, the select and control gates are formed of a single layer of polysilicon formed to a thickness of about 1,000 Å.

Fabrication of the disclosed devices 1, 26, 48, may be carried out pursuant to conventional CMOS protocols, except for the formation of charge storage layer 14, 40, 66. The nano-crystals 18, 42, 65 may be produced by self-assembly during LPCVD. Although the nano-crystals are shown in FIGS. 1, 3 and 4 as being spherical, LPCVD typically results in the formation of separated nano-crystals 30 having generally hemispherical or partly spherical shapes. The average spacing between neighboring nano-crystals 18, 42, 65 is about 2 nm or more, and the density of the nano-crystals in the charge storage layer 14, 40, 66 is about $10^9$ to about $10^{12}$ $cm^{-2}$. The thickness of the charge storage layer may range from about 4 nm to about 40 nm. Those skilled in the art will appreciate that various parameters of LPCVD, such as time, pressure, temperature and the gasses used may be adjusted to obtain nano-crystals of selected sizes, spacings and densities.

The disclosed memory devices enable lower cost production using less process steps than conventional devices. Conventional nonvolatile memory devices required several layers of polysilicon to form the control and/or select gates. The disclosed devices utilize only a single layer of polysilicon to achieve the same functionality. With prior devices, additional polysilicon layers result in more complicated process flows and take additional time, resulting in reduced yield. The disclosed embedded non-volatile memory devices with CMOS compatible process will result in high yield at lower cost as compared to current devices. The disclosed memory devices also enable lower cost production due to smaller bit-cell size as compared to conventional devices.

The disclosed embodiments of the invention is illustrative of the invention rather than limiting of the invention. Revisions and modifications may be made to methods, materials, structures and dimensions in accord with the preferred embodiment of the invention while still providing an embodiment in accord with the invention, further in accord with the accompanying claims.

The invention claimed is:

1. A method of forming a non-volatile memory device, comprising:
   providing a semiconductor substrate;
   forming source and drain regions in the semiconductor substrate, the source and drain regions separated by a channel region;
   forming a continuous layer over the substrate, the continuous layer positioned between the source region and the drain region; and
   forming a control gate comprising a single layer of polysilicon over a first portion of the continuous layer, and a select gate comprising the single layer of polysilicon over a second portion of the continuous layer, the select gate spaced apart from the control gate,
   wherein the first portion of the continuous layer comprises a plurality of nano-crystals, and the second portion of the continuous layer does not include nano-crystals.

2. The method of claim 1, wherein the plurality of nano-crystals are produced by self-assembly during chemical vapor deposition (CVD) of the continuous layer.

3. The method of claim 1, wherein the plurality of nano-crystals comprise Silicon or Germanium.

4. The method of claim 1, wherein the plurality of nano-crystals have diameters in the range of about 1 nanometer (nm) to about 10 nm.

5. The method of claim 1, further comprising connecting the control gate to a word line and the drain to a bit line.

6. The method of claim 1, wherein the continuous layer has a thickness of about 70 Angstroms (Å) to about 400 Å.

7. The method of claim 1, wherein the continuous layer comprises an insulating material.

8. A method of forming a non-volatile memory device, comprising:
   forming a source and a drain region in a semiconductor substrate such that the source region is separated from the drain region by a channel region;
   forming a continuous layer over the substrate between the source region and the drain region;
   forming a control gate including a single layer of polysilicon over a first portion of the continuous layer; and
   forming a select gate including the single layer of polysilicon over a second portion of the continuous layer such that the select gate is spaced apart from the control gate,
   wherein the first portion of the continuous layer includes a plurality of nano-crystals, and the second portion of the continuous layer does not include nano-crystals.

9. The method of claim 8, wherein the plurality of nano-crystals are produced by self-assembly during chemical vapor deposition (CVD) of the continuous layer.

10. The method of claim 8, wherein the plurality of nano-crystals include at least one of silicon or germanium.

11. The method of claim 8, wherein the plurality of nano-crystals have diameters in the range of about 1 nanometer (nm) to about 10 nm.

12. The method of claim 8, further comprising connecting the control gate to a word line and the drain to a bit line.

13. The method of claim 8, wherein the continuous layer has a thickness of about 70 Angstroms (Å) to about 400 Å.

14. The method of claim 8, wherein the continuous layer includes an insulating material.

15. A method of forming a non-volatile memory device, comprising:
   forming a source and a drain region in a semiconductor substrate such that the source region is separated from the drain region by a channel region;
   forming a continuous layer over the substrate between the source region and the drain region;
   forming a control gate including a single layer of polysilicon over a first portion of the continuous layer;
   forming a select gate including the single layer of polysilicon over a second portion of the continuous layer such that the select gate is spaced apart from the control gate; and connecting the control gate to a word line and the drain to a bit line, wherein the first portion of the continuous layer includes a plurality of nano-crystals, and the second portion of the continuous layer does not include nano-crystals.

16. The method of claim 15, wherein the plurality of nano-crystals are produced by self-assembly during chemical vapor deposition (CVD) of the continuous layer.

17. The method of claim 15, wherein the plurality of nano-crystals include at least one of silicon or germanium.

18. The method of claim 15, wherein the plurality of nano-crystals have diameters in the range of about 1 nanometer (nm) to about 10 nm.

19. The method of claim 15, wherein the continuous layer has a thickness of about 70 Angstroms (Å) to about 400 Å.

20. The method of claim 15, wherein the continuous layer includes an insulating material.

\* \* \* \* \*